(12) United States Patent
Kumar et al.

(10) Patent No.: US 8,264,899 B2
(45) Date of Patent: Sep. 11, 2012

(54) ASSISTANCE IN RESET OF DATA STORAGE ARRAY

(75) Inventors: Ashish Kumar, Jharkhand (IN); Rajiv Kumar Roy, Uttar Pradesh (IN)

(73) Assignee: STMicroelectronics International N.V., Amsterdam (NL)

( * ) Notice: Subject to any disclaimer, the term of this patent is extended or adjusted under 35 U.S.C. 154(b) by 248 days.

(21) Appl. No.: 12/621,660

(22) Filed: Nov. 19, 2009

(65) Prior Publication Data
US 2010/0135095 A1   Jun. 3, 2010

(30) Foreign Application Priority Data
Nov. 19, 2008   (IN) .......................... 2616/DEL/2008

(51) Int. Cl.
*G11C 7/00* (2006.01)

(52) U.S. Cl. ....................................... 365/204; 365/154
(58) Field of Classification Search .................. 365/154, 365/204
See application file for complete search history.

(56) References Cited

U.S. PATENT DOCUMENTS
2001/0053090 A1* 12/2001 Takata et al. ............. 365/185.08
2004/0120195 A1* 6/2004 Okuda ........................ 365/200
* cited by examiner

*Primary Examiner* — Hoai V Ho
(74) *Attorney, Agent, or Firm* — Allen, Dyer, Doppelt, Milbrath & Gilchrist, P.A.

(57) ABSTRACT

A system is capable of assisting in reset of a data storage array including data storage array including one or more data storage array nodes. The system includes a control unit coupled to the data storage array configured to produce a control signal to reset the data storage array, and a reset unit communicatively coupled to the data storage array and the control unit configured to reset the data storage array by charge injection to the one or more data storage array nodes.

35 Claims, 11 Drawing Sheets

ASSISTANCE IN RESET OF DATA STORAGE ARRAY

FIELD OF THE INVENTION

The present disclosure pertains to reset of data storage arrays, and, more specifically, to data storage arrays such as Static Random Access Memories.

BACKGROUND OF THE INVENTION

The resetting of a data storage array typically involves clearing or "zeroing" the contents of all of the storage locations or cells of the data storage array. This is achieved by addressing each storage location and writing a "0" into each cell in response to the occurrence of a reset control signal. A common method of resetting the data storage array to "0" or "1" is by selecting all word lines of the data storage array and forcing all bit lines to a reference potential. (The reference potential is usually ground).

According to another method of resetting a data storage array, the common ground of data storage array is raised to the value of supply voltage VDD as shown in FIG. 1. VGND of the first section of cells of the data storage array is driven to a voltage VDD by applying of a reset control signal CLEAR external to the data storage array. Transistor 106 passes logic "1" to node A, which is initially at logic "0". Transistor 106 is turned off and transistor 104 is turned ON, which further assists in initializing the data storage array after a reset control signal has been encountered.

BRIEF DESCRIPTION OF THE DRAWINGS

Features and aspects of various embodiments of the disclosure will be better understood when the following detailed description is read with reference to the accompanying drawings in which like characters represent like parts throughout the drawings.

DETAILED DESCRIPTION OF THE PREFERRED EMBODIMENTS

Figure 1:
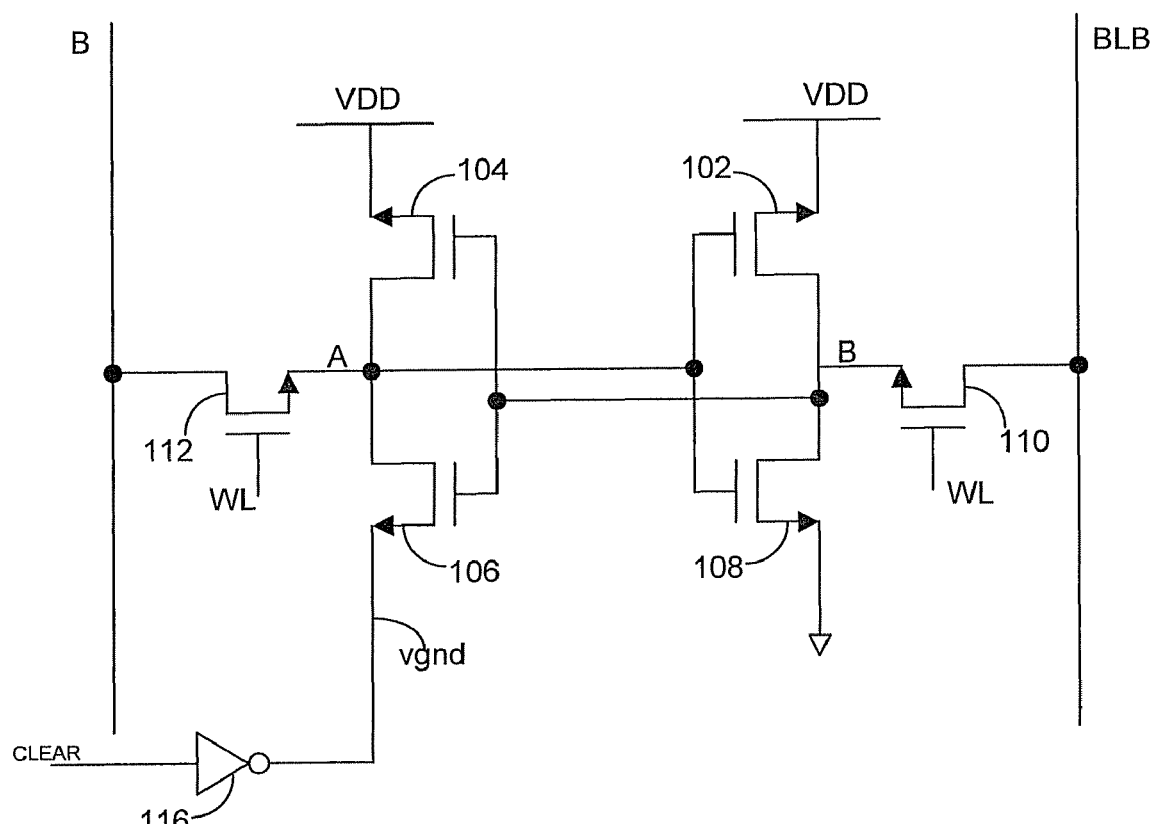
FIG. 1 is a schematic diagram illustrating assistance in reset for a data storage array in accordance with the prior art.

The embodiments of the present invention will be described in detail with reference to the accompanying drawings. However, the present disclosure is not limited to these embodiments. The present disclosure can be modified in various forms. The embodiments of the present disclosure described herein are only provided to explain more clearly the present disclosure to the ordinarily skilled in the art. In the accompanying drawings, like reference numerals are used to indicate like components.

The embodiments of the present disclosure refer to assistance in reset of a data storage array. A system capable of assisting in reset of a data storage array in accordance with an embodiment of the present disclosure comprises a data storage array comprising one or more data storage array nodes, a control unit coupled to the data storage array configured to produce a control signal to reset the data storage array, and a reset unit communicatively coupled to the data storage array and the control unit configured to reset the data storage array by charge injection to the one or more data storage array nodes. The data storage array comprises a plurality of memory cells, word lines and bit lines for operation. Each memory cell comprises a plurality of voltage controlled units, which, in one embodiment, comprise PMOS/NMOS transistors. The reset unit is configured to couple to the data storage array only on receiving the control signal from the control unit.

According to an embodiment of the present disclosure, the reset unit is configured to reset the data storage array by lowering the ground voltage GND of one half of the memory cell to a negative voltage level by injecting negative charge. In an example of the embodiment, an NMOS capacitor is coupled at the terminal of the memory cell coupled to GND voltage.

Yet another embodiment of the present disclosure illustrates a reset unit comprising a first rail arranged and configured to produce coupling capacitance with the one or more data storage array nodes to inject positive charge in one half of a plurality of memory cells, and a second rail configured to produce coupling capacitance with the one or more data storage array nodes to inject negative charge in another half of plurality of memory cells.

According to an embodiment of the present disclosure, a reset unit is configured to reset the data storage array by lowering the substrate voltage of voltage controlled units of one half of the memory cells below the positive supply voltage of the data storage array. An example embodiment comprises the lowering of the substrate voltage by injecting negative charge using NMOS capacitors. Another example refers to lowering the substrate voltage by coupling the substrate to the supply of other half of the memory cell.

According to an embodiment of the present disclosure, a reset unit is configured to reset the data storage array by raising the supply voltage of one half of the memory cell above the positive supply voltage of the data storage array by injecting positive charge. An example of the embodiment injects positive charge by use of NMOS capacitors.

An embodiment of the present disclosure illustrates a method for assisting in reset of a data storage array comprising receiving a control signal to reset the data storage array, coupling a reset unit to the data storage array, and resetting the data storage array. According to an embodiment of the present disclosure, resetting the data storage array comprises lowering ground voltage of one half of the memory cell to a negative voltage level by injecting negative charge.

According to an embodiment of the present disclosure, resetting the data storage array comprises producing coupling capacitances in data storage array nodes by arranging a first rail in one half of memory cell, producing coupling capacitances in data storage array nodes by arranging a second rail in other half of memory cell, injecting a positive charge in said one half of memory cell by the first rail, and injecting a negative charge in the other half of the memory cell by the second rail. Another embodiment of the present disclosure refers to resetting the data storage array by lowering substrate voltage of voltage controlled units in one half of the memory cell below the positive supply voltage of the data storage array. According to another embodiment of the present disclosure, resetting the data storage array comprises raising supply voltage of one half of the memory cell above the positive supply voltage of the data storage array by injecting positive charge.

An embodiment of the present disclosure describes a storage device capable of assisting in reset of a data storage array. The device includes a data storage array comprising one or more data storage array nodes, a control unit coupled to the data storage array configured to produce a control signal to reset the data storage array, and a reset unit communicatively coupled to the data storage array and the control unit and configured to reset the data storage array by charge injection to the one or more data storage array nodes.

Some of the embodiments are now described in detail along with figures for better comprehension.

Figure 2:
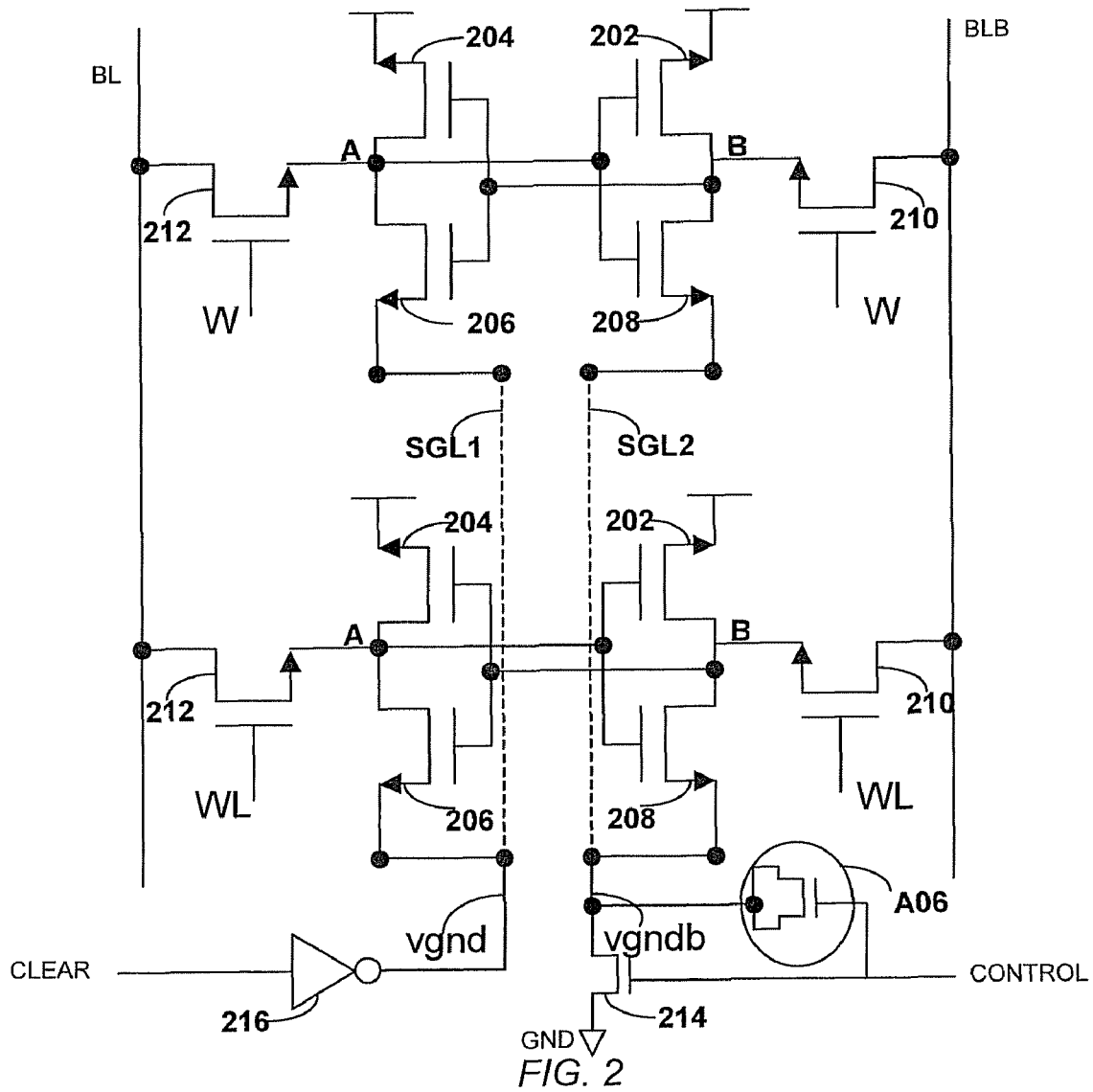
FIG. 2 is a schematic diagram illustrating a system capable of assisting in reset of a data storage array by negative charge injection in accordance with an embodiment of the present invention.

FIG. 2 illustrates a system capable of assisting in reset of a data storage array by negative charge injection in accordance with an embodiment of the present disclosure. The system comprises a data storage array with a plurality of memory cells where each memory cell comprises a plurality of voltage controlled units 202, 204, 206 and 208. The data storage array also comprises word lines W, WL (212, 210) and bit lines BL, BLB. The system comprises a control unit which provides a control signal to reset the data storage array. The control unit in accordance with the embodiment comprises a logic unit 216 which provides a control signal CLEAR to the data storage array. The reset unit, in accordance with the present embodiment, comprises NMOS capacitor A06 and voltage controlled switch 214. These components reset the data storage array on receiving the control signal CLEAR. VGND is selected through CLEAR signal consequent to which VGND is pulled up to write logic "1" at node A of the data storage array. VGNDB is then pulled down to a negative voltage to enforce reset operation of the data storage array. The arrangement introduces negative charge, where charge is fed through NMOS capacitor A06. As the negative voltage required is small, one is not required to use large capacitors. Therefore, the data storage array is reset.

Figure 3:
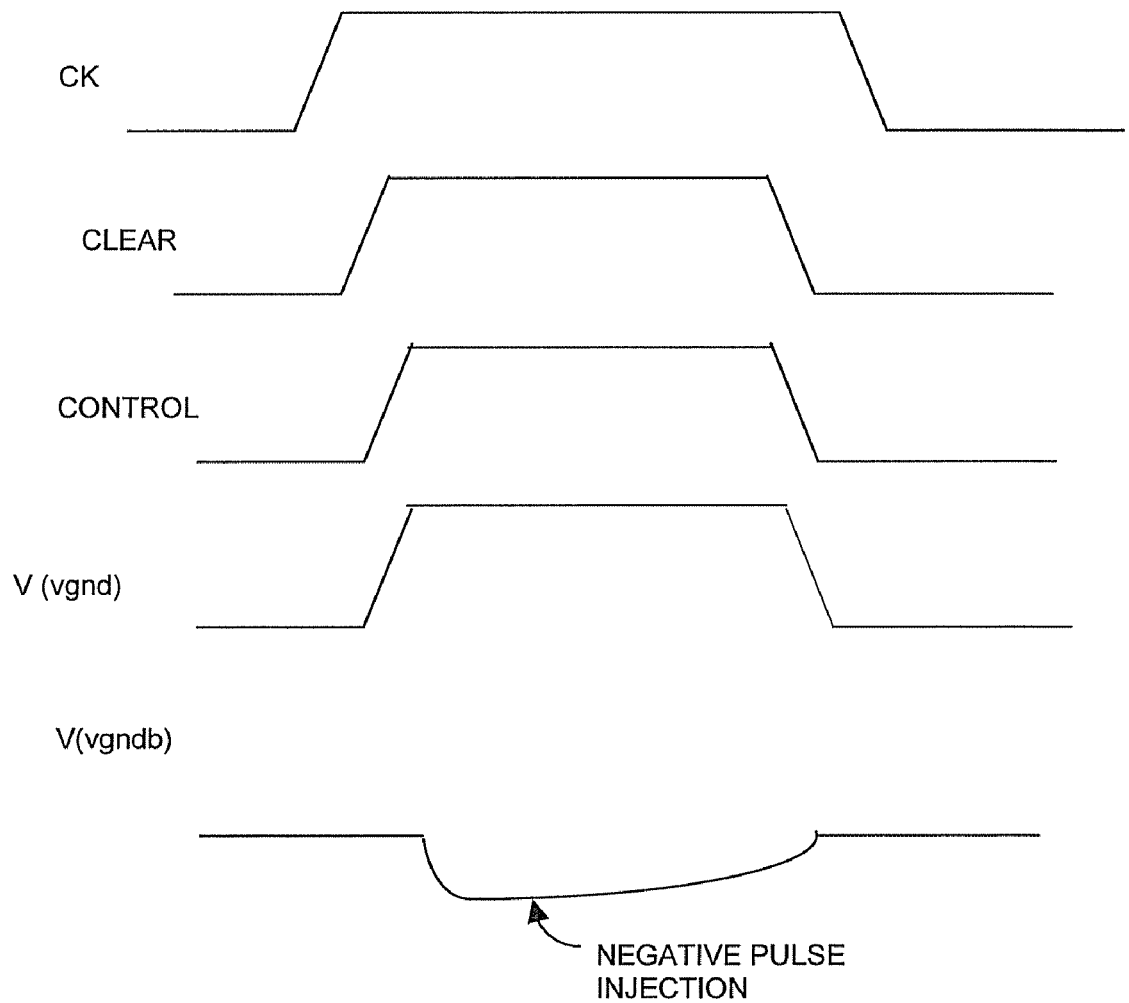
FIG. 3 is a timing diagram for a system capable of assisting in reset of a data storage array by negative charge injection in accordance with the embodiment described in FIG. 2.

FIG. 3 shows a timing diagram for a system capable of assisting in reset of a data storage array by negative charge injection in accordance with an embodiment of the present disclosure as described in FIG. 2. The positive charge injection is depicted through waveform of $V_{(VGNDB)}$.

Figure 4:
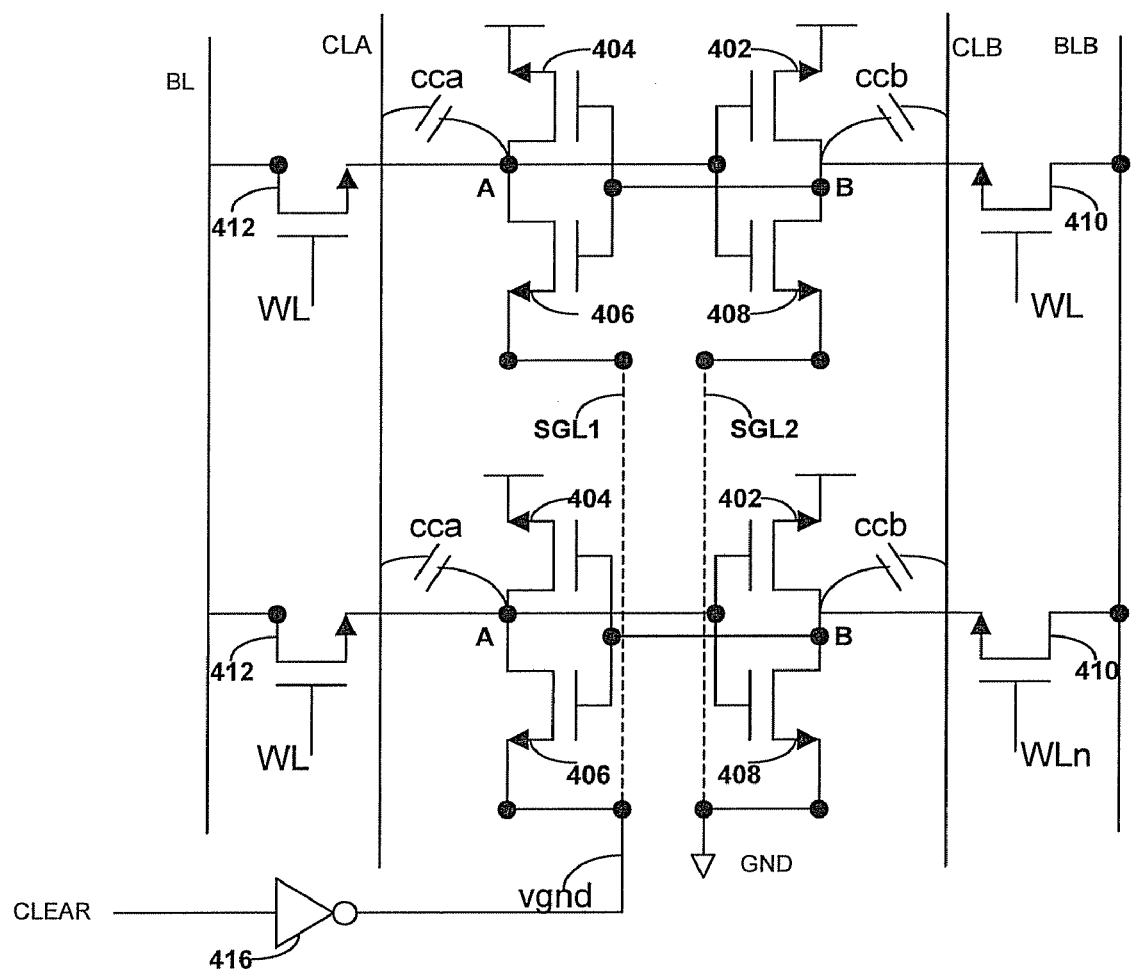
FIG. 4 is a schematic diagram illustrating a system capable of assisting in reset of a data storage array by positive and negative charge injection according to an embodiment of the present disclosure.

FIG. 4 illustrates a system capable of assisting in reset of a data storage array by positive and negative charge injection according to an embodiment of the present disclosure. The system according to the embodiment comprises a data storage array with a plurality of memory cells, where each memory cell comprises a plurality of voltage controlled units 402, 404, 406 and 408. The data storage array also comprises word lines W, WL (412, 410) and bit lines BL, BLB. The system comprises a control unit, which provides a control signal to reset the data storage array. The control unit in accordance with the embodiment comprises a logic unit 416 which provides a control signal CLEAR to the data storage array. The system comprises a reset unit, which comprises a first rail CLA arranged and configured to produce coupling capacitance cca with node A of memory cells in the data storage array. CLA couples positive charge to one half of plurality of memory cells, i.e. to node A of each memory cell, which assists in writing logic "1" at the node. Similarly, the reset unit comprises a second rail CLB configured to produce coupling capacitance ccb with node B of memory cells in the data storage array. CLB couples negative charge to other half of plurality of memory cells, i.e. to node B of each memory cell which pulls the logic down to "0". Thus, data storage array is reset without any process mismatch.

Figure 5:
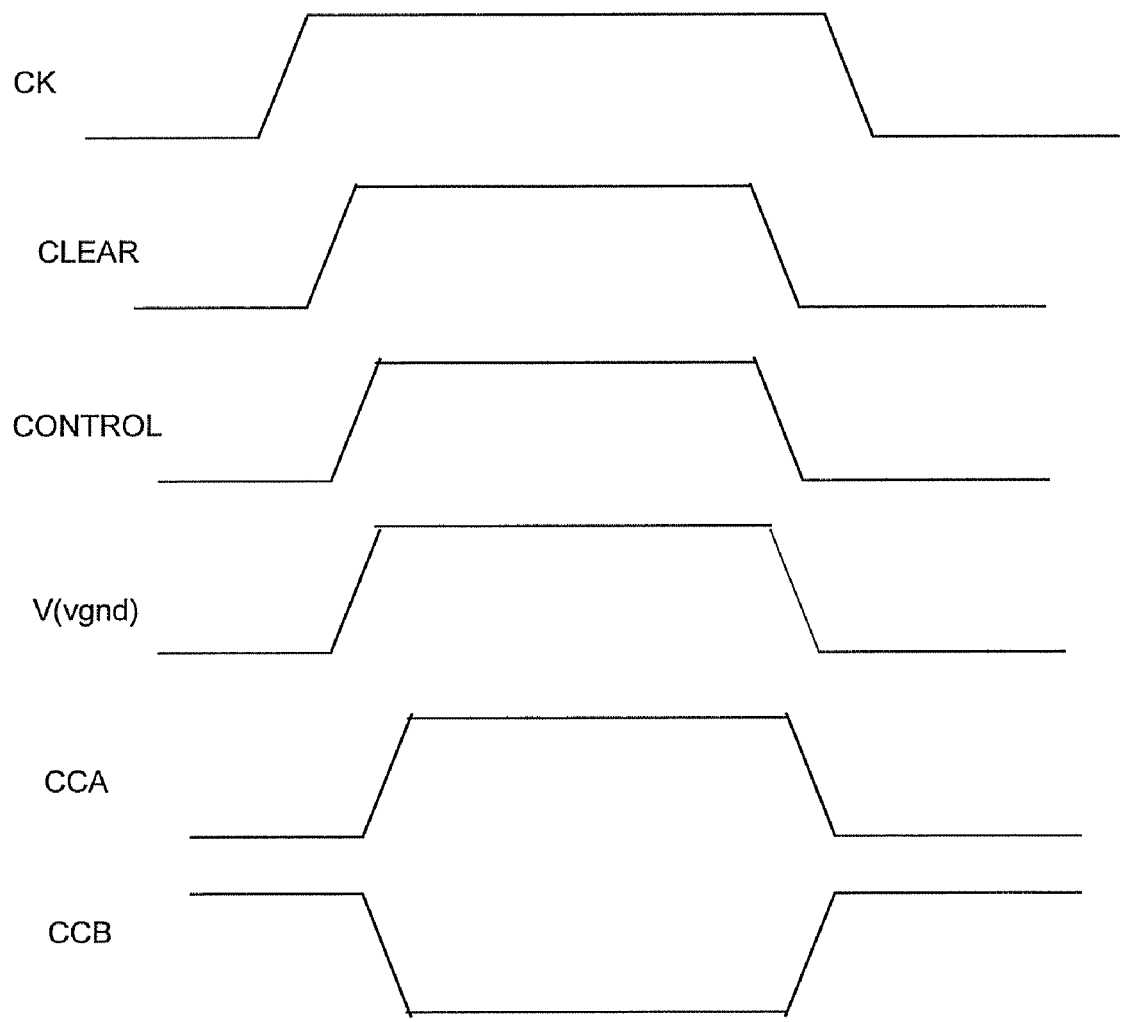
FIG. 5 is a timing diagram for a system capable of assisting in reset of a data storage array according to the embodiment described in FIG. 4.

FIG. 5 shows a timing diagram for a system capable of assisting in reset of a data storage array by positive and negative charge injection according to an embodiment of the present disclosure described in FIG. 4. The positive and negative charge injections are clear from the waveforms for cca and ccb.

Figure 6:
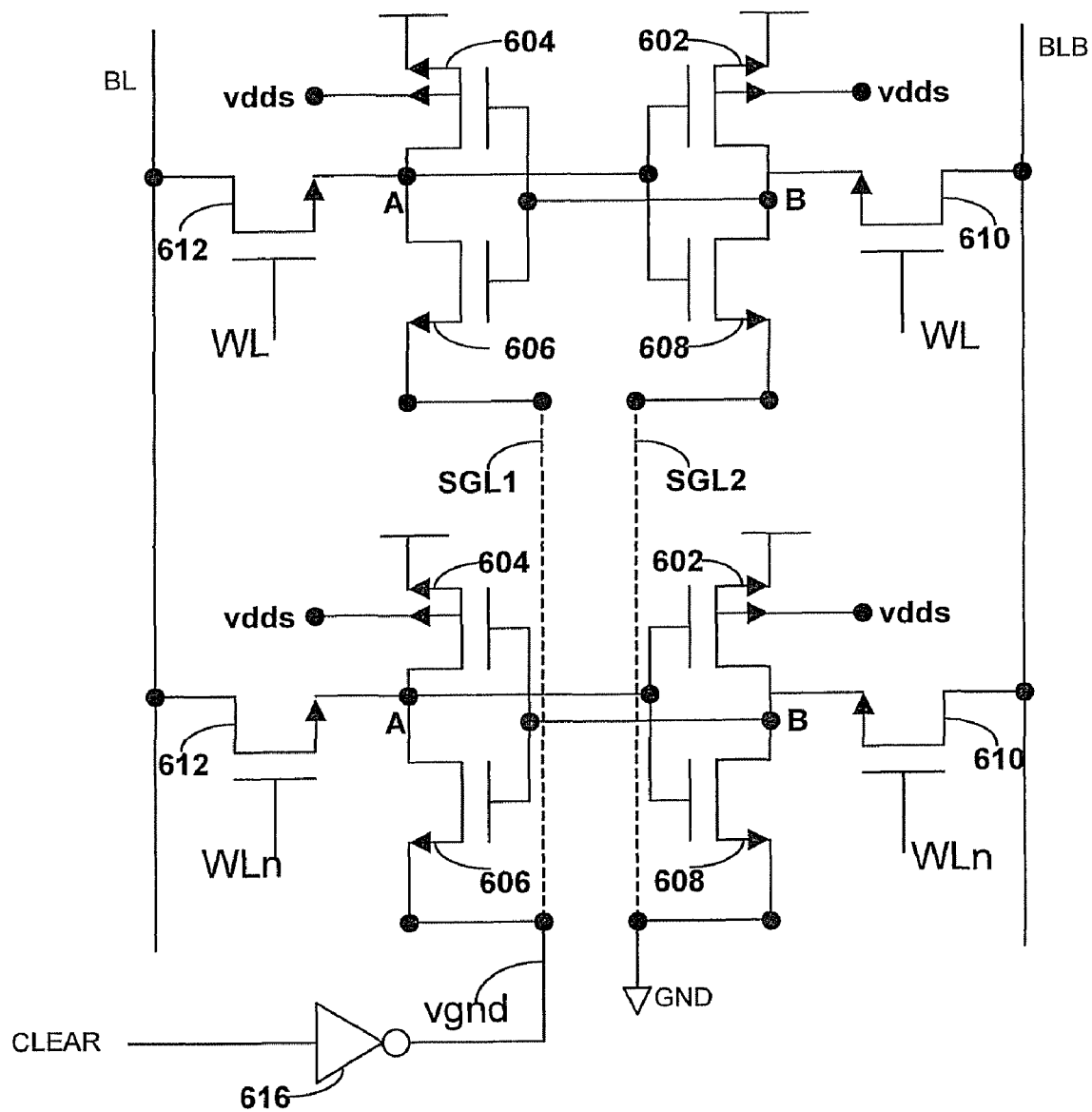
FIG. 6 is a schematic diagram illustrating a system capable of assisting in reset of a data storage array by providing a substrate voltage lower than supply voltage in accordance with an embodiment of the present disclosure.
Figure 7:
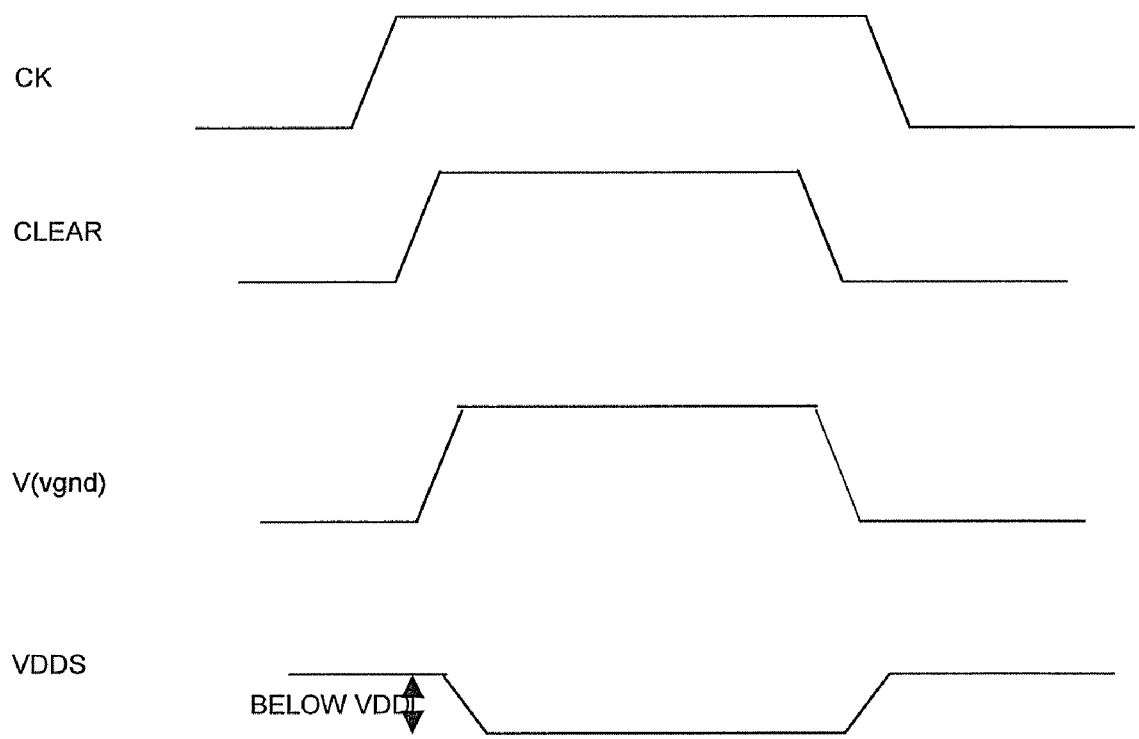
FIG. 7 is a timing diagram for a system capable of assisting in reset of a data storage array according to the embodiment described in FIG. 6.
Figure 8:
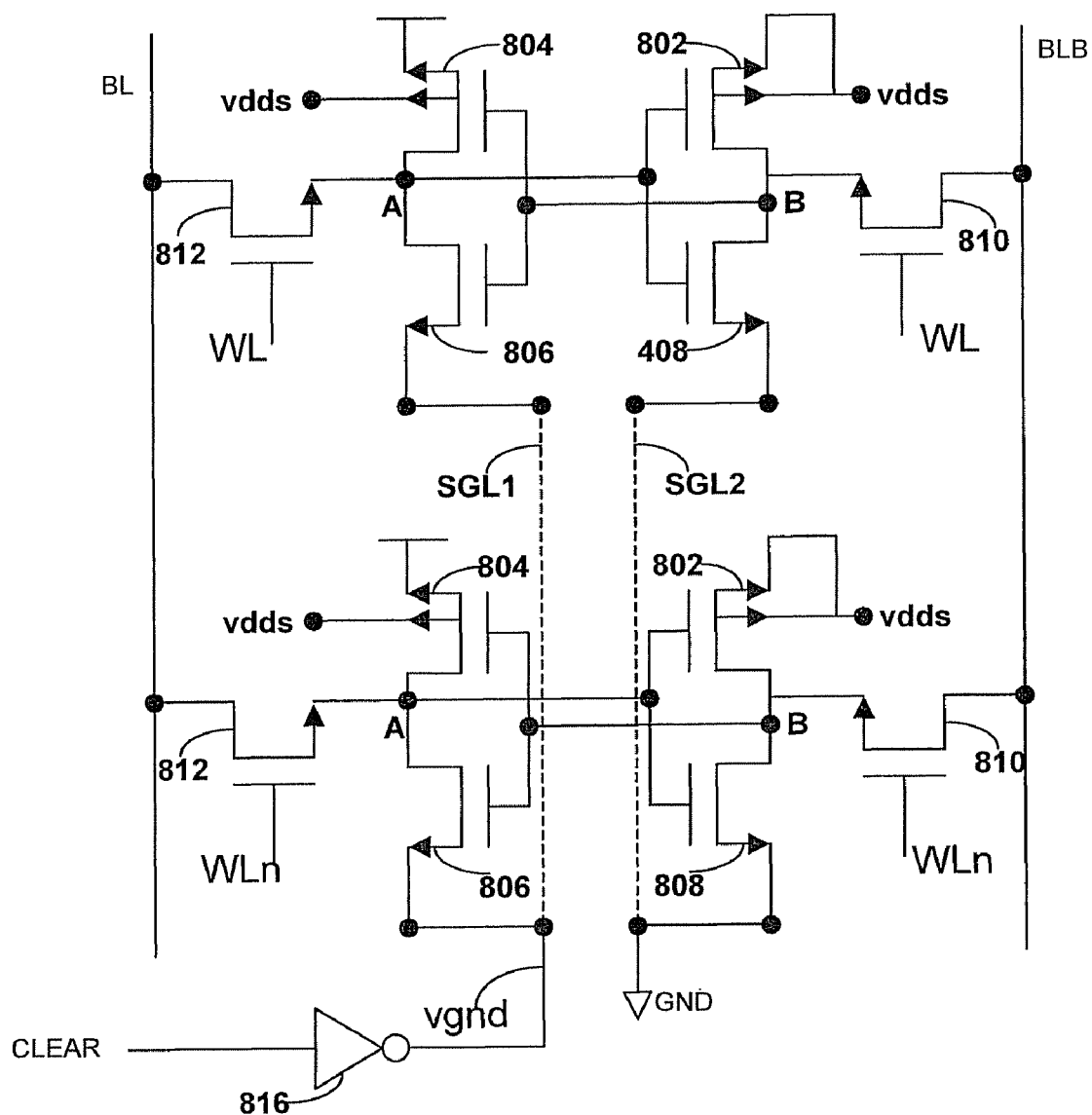
FIG. 8 is a schematic diagram illustrating a system capable of assisting in reset of a data storage array by coupling substrate voltage to supply of second section of cells of the data storage array in accordance with an embodiment of the present disclosure.

FIGS. 6 to 9 illustrate a system capable of assisting in reset of the data storage array wherein the reset unit is configured to lower the substrate voltage of voltage controlled units in one half of the each memory cell below the positive supply voltage of the data storage array in accordance with some embodiments of the present disclosure. The system, as illustrated in FIGS. 6 and 8, comprises a data storage array with a plurality of memory cells, where each memory cell comprises a plurality of voltage controlled units 602, 604, 606, 608, 802, 804, 806 and 808. The data storage array also comprises word lines W, WL (612, 610 and 812, 810) and bit lines BL, BLB. The system comprises a control unit, which provides a control signal to reset the data storage array. The control unit in accordance with the embodiment comprises a logic unit 616 and 816, which provides a control signal CLEAR to the data storage array.

According to the embodiment of the present disclosure illustrated in FIG. 6 illustrates the reset unit is configured to lower the substrate voltage VDDS of voltage controlled units of one half of each memory cell, i.e. PMOS 604 in the data storage array below the positive supply voltage VDD of the data storage array. The lowering of substrate voltage VDDS in turn lowers the threshold voltage of PMOS 604, which assists in writing logic "1" at node A. The substrate voltage VDDS is lowered to an intermediate voltage during a reset operation by injecting a negative charge with NMOS capacitors as described in previous embodiments.

FIG. 7 shows a timing diagram for a system for providing assistance in reset of a data storage array by providing a substrate voltage lower than supply voltage according to an embodiment of the present disclosure. The lowering of the substrate voltage below VDD is clear from the waveform against VDDS.

According to another embodiment of the present disclosure described in FIG. 8, the substrate voltage of PMOS 804 is lowered below the positive supply voltage VDD by coupling supply of voltage controlled units of other half of memory cells of data storage array as shown. The supply of voltage controlled unit 802 is coupled to the substrate voltage VDDS, which lowers the threshold voltage of voltage controlled unit, i.e. transistor 804, thus transferring logic "1" on node A and pulling down node B to logic "0".

Figure 9:
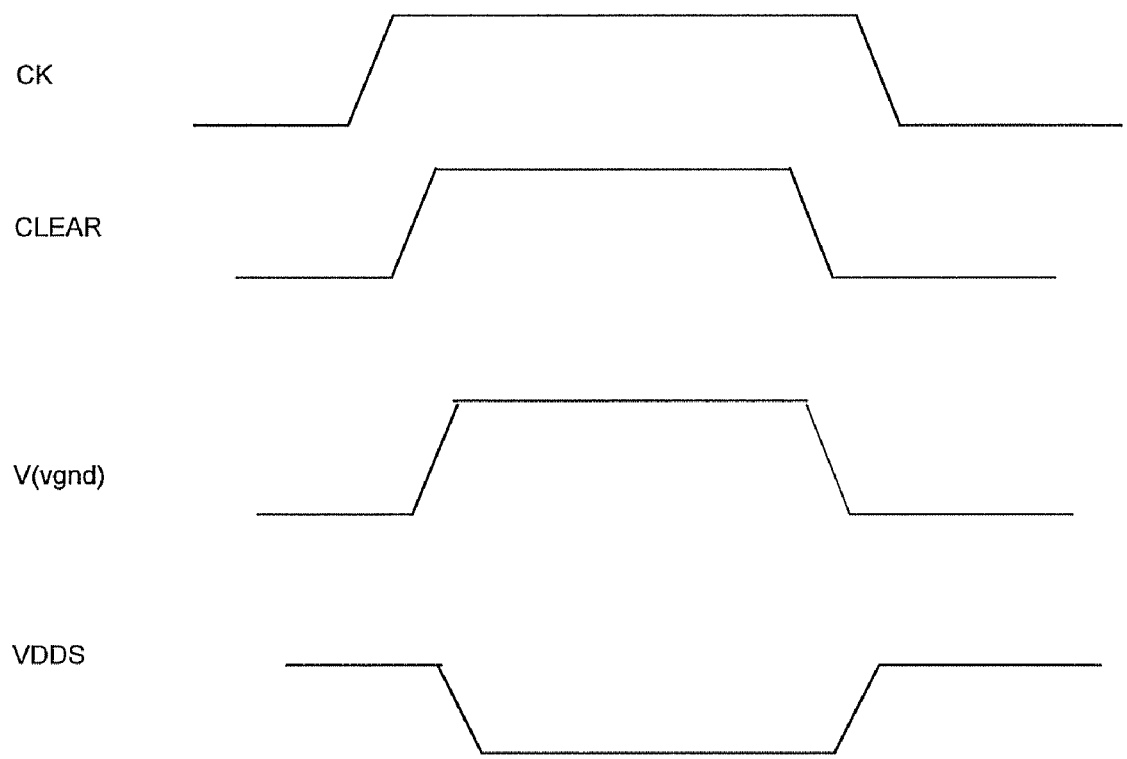
FIG. 9 is a timing diagram for a system capable of assisting in reset of a data storage array according to the embodiment described in FIG. 8.

FIG. 9 shows a timing diagram for a system capable of assisting in reset of a data storage array according to the embodiment described in FIG. 8. The lowering of the substrate voltage at 804 below VDD is clear from the waveform against VDDS.

Figure 10:
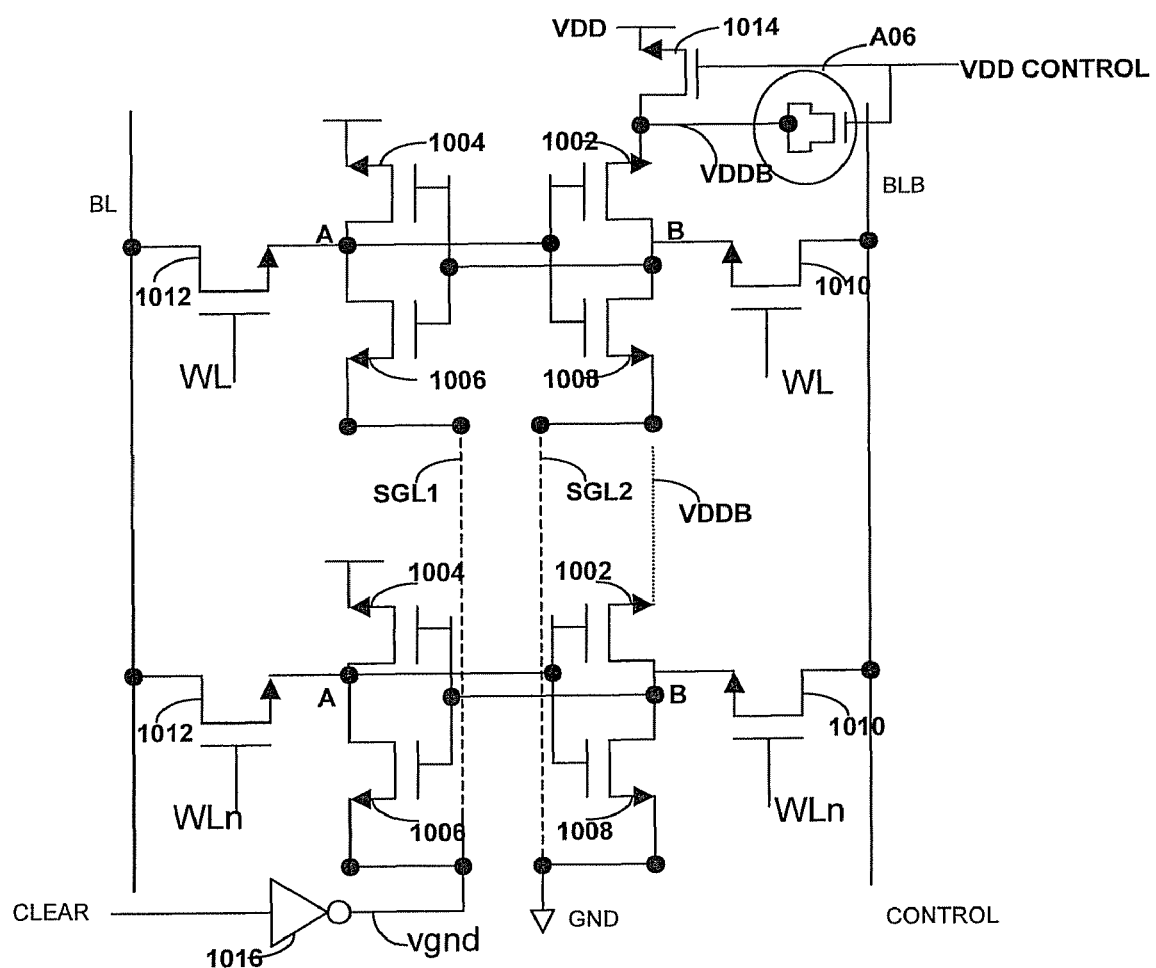
FIG. 10 is a schematic diagram illustrating a system capable of assisting in reset of a data storage array by providing one section of data storage array a supply higher than supply voltage of the data storage array in accordance with an embodiment of the present disclosure.
Figure 11:
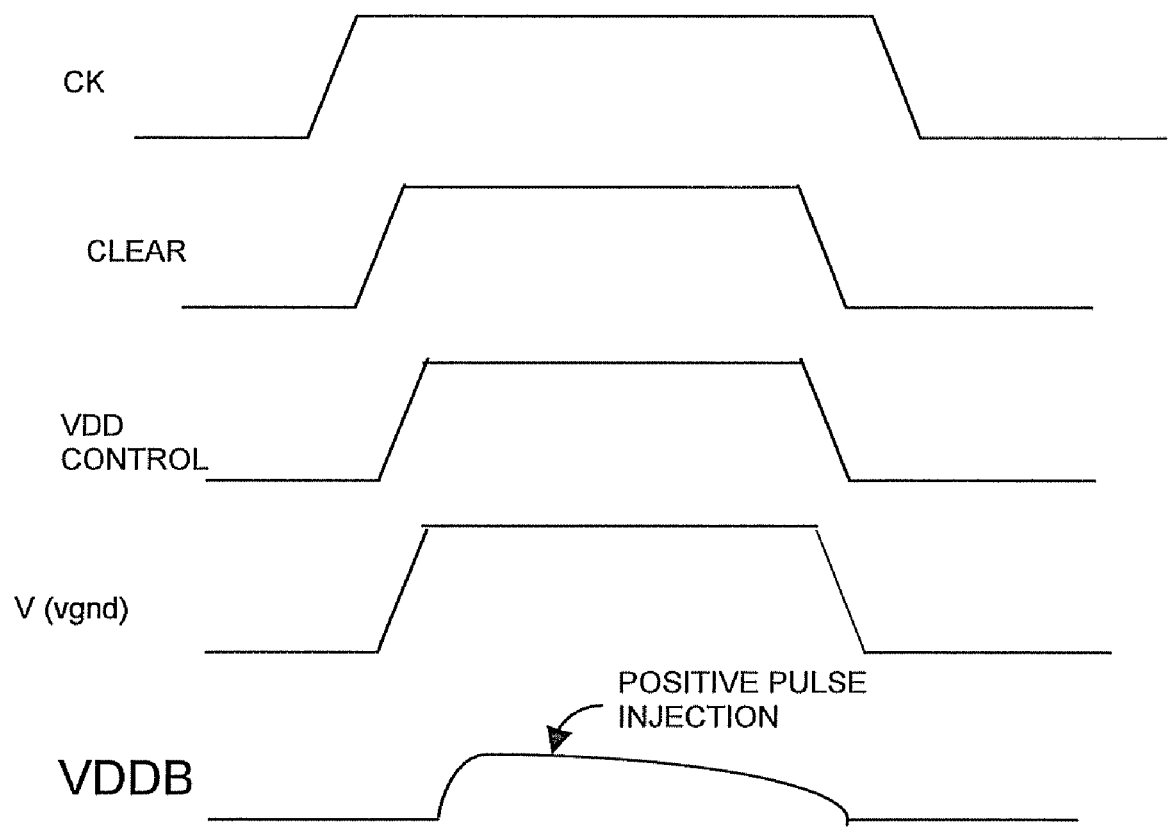
FIG. 11 is a timing diagram for a system capable of assisting in reset of a data storage array according to the embodiment described in FIG. 10.

FIG. 10 describes a system capable of assisting in reset of a data storage array in accordance with an embodiment of the present disclosure. The reset unit is configured to raise supply voltage of one half of each memory cell above positive supply voltage VDD by injecting positive charge. The system comprises a data storage array with a plurality of memory cells, where each memory cell comprises a plurality of voltage controlled units 1002, 1004, 1006 and 1008. The data storage array also comprises word lines W, WL (1012, 1010) and bit lines BL, BLB. The system comprises a control unit, which provides a control signal to reset the data storage array. The control unit, in accordance with the embodiment, comprises a logic unit 1016, which provides a control signal CLEAR to the data storage array. The supply to one section of cells of the data storage array VDDB is pulled above supply voltage VDD. Transistor 1002 assists in transfer of VDD to node A of the data storage array through transistor 1006. Thus, a positive charge is implemented on VDDB with the use of NMOS capacitors. FIG. 11 shows a timing diagram for a system capable of assisting in reset of a data storage array in accordance with an embodiment of the present disclosure described in FIG. 10.

The disclosure shows and describes only the embodiments of the disclosure; however, the disclosure is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the disclosure and to enable others skilled in the art to utilize the disclosure in such, or other, embodiments and with the various modifications required by the particular applications or uses of the disclosure. Accordingly, the description is not intended to limit the disclosure as disclosed herein. Also, it is intended that the appended claims be construed to include alternative embodiments.

The invention claimed is:

1. A system for resetting a data storage array comprising at least one data storage array node, the system comprising:
    a control unit coupled to the data storage array and configured to produce a control signal to reset the data storage array; and
    a reset unit coupled to the data storage array and said control unit and configured to reset the data storage array by charge injection to said at least one data storage array node, the charge injection including injecting positive charge into a portion and negative charge in an other portion of the data storage array.

2. The system according to claim 1 wherein the data storage array comprises a plurality of memory cells, and word lines and bit lines coupled thereto for operation.

3. The system according to claim 2 wherein each memory cell comprises a plurality of voltage controlled units.

4. The system according to claim 1 wherein said reset unit is configured to be coupled to the data storage array based upon the control signal from said control unit.

5. The system according to claim 2 wherein said reset unit is configured to reset the data storage array by lowering a reference voltage of a portion of said plurality of memory cells to a negative voltage level by injecting the negative charge.

6. The system according to claim 5 wherein the portion of said plurality of memory cells is half of said plurality of memory cells.

7. The system according to claim 2 wherein said reset unit comprises:
    a first rail configured to produce coupling capacitance with said at least one data storage array node to inject the positive charge in the portion of said plurality of memory cells; and
    a second rail configured to produce coupling capacitance with said at least one data storage array node to inject the negative charge in the other portion of said plurality of memory cells.

8. The system according to claim 7 wherein the portion of said plurality of memory cells is a first half of said plurality of memory cells and the other portion of said plurality of memory cells is a second half of said plurality of memory cells.

9. The system according to claim 3 wherein said reset unit is configured to reset the data storage array by lowering a substrate voltage of said plurality of voltage controlled units in a portion of each memory cell below a positive supply voltage of the data storage array.

10. The system according to claim 9 wherein said reset unit is configured to reset the data storage array by raising a supply voltage of a portion of each memory cell above the positive supply voltage of the data storage array by injecting the positive charge.

11. The system according to claim 10 wherein the portion of said plurality of memory cells is a half portion.

12. A storage device comprising:
    a data storage array comprising at least one data storage array node and a plurality of memory cells coupled thereto;
    a control unit coupled to said data storage array and configured to produce a control signal to reset said data storage array; and
    a reset unit coupled to said data storage array and said control unit and configured to reset said data storage array by lowering a reference voltage of a portion of said plurality of memory cells to a negative voltage level by injecting charge to said at least one data storage array node.

13. The storage device according to claim 12 wherein each memory cell comprises a plurality of voltage controlled units.

14. The storage device according to claim 12 wherein said reset unit is configured to be coupled to said data storage array based upon the control signal from said control unit.

15. The storage device according to claim 12 wherein the portion of said plurality of memory cells is a half portion of said plurality of memory cells.

16. The storage device according to claim 12 wherein said reset unit comprises:
    a first rail configured to produce coupling capacitance with said at least one data storage array node to inject positive charge in a portion of said plurality of memory cells; and a second rail configured to produce coupling capacitance with said at least one data storage array node to inject negative charge in an other portion of said plurality of memory cells.

17. The storage device according to claim 16 wherein the portion of said plurality of memory cells is a first half of said plurality of memory cells and the other portion of said plurality of memory cells is a second half of said plurality of memory cells.

18. The storage device according to claim 13 wherein said reset unit is configured to reset said data storage array by lowering a substrate voltage of said plurality of voltage controlled units in a portion of each memory cell below a positive supply voltage of said data storage array.

19. The storage device according to claim 18 wherein said reset unit is configured to reset said data storage array by a raising supply voltage of a portion of each memory cell above the positive supply voltage of said data storage array by injecting positive charge.

20. The storage device according to claim 19 wherein the portion of said plurality of memory cells is a half portion.

21. A method of operating a system for resetting a data storage array comprising at least one data storage array node and a plurality of memory cells coupled thereto, the method comprising:
producing a control signal to reset the data storage array; and
using a reset unit coupled to the data storage array to reset the data storage array by charge injection to the at least one data storage array node, the charge injection including injecting positive charge into a portion and negative charge in another portion of the data storage array.

22. The method according to claim 21 further comprising coupling the reset unit to the data storage array on receiving the control signal.

23. The method according to claim 21 wherein the resetting comprises lowering a reference voltage of a portion of the plurality of memory cells to a negative voltage level by injecting the negative charge.

24. The method according to claim 23 wherein the portion of the plurality of memory cells is a half portion of the plurality of memory cells.

25. The method according to claim 22 further comprising:
producing coupling capacitance with the at least one data storage array node to inject the positive charge in the portion of the plurality of memory cells; and
producing coupling capacitance with the at least one data storage array node to inject the negative charge in the other portion of the plurality of memory cells.

26. The method according to claim 25 wherein the portion of the plurality of memory cells is a first half of the plurality of memory cells and the other portion of the plurality of memory cells is a second half of the plurality of memory cells.

27. The method according to claim 21 wherein the resetting comprises lowering a substrate voltage of a plurality of voltage controlled units in a portion of each memory cell below a positive supply voltage of the data storage array.

28. The method according to claim 27 wherein the resetting comprises raising a supply voltage of a portion of each memory cell above the positive supply voltage of the data storage array by injecting the positive charge.

29. The method according to claim 28 wherein the portion of the plurality of memory cells is a half portion.

30. A system for resetting a data storage array comprising at least one data storage array node, the system comprising:
a control unit coupled to the data storage array and configured to produce a control signal to reset the data storage array, the data storage array comprising a plurality of memory cells, and word lines and bit lines coupled thereto for operation; and
a reset unit coupled to the data storage array and said control unit and configured to reset the data storage array by charge injection to said at least one data storage array node and by lowering a reference voltage of a portion of said plurality of memory cells to a negative voltage level by injecting negative charge.

31. The system according to claim 30 wherein the data storage array comprises a plurality of memory cells, and word lines and bit lines coupled thereto for operation.

32. The system according to claim 31 wherein each memory cell comprises a plurality of voltage controlled units.

33. A method of operating a system for resetting a data storage array comprising at least one data storage array node and a plurality of memory cells coupled thereto, the method comprising:
producing a control signal to reset the data storage array; and
using a reset unit coupled to the data storage array to reset the data storage array by charge injection to the at least one data storage array node, the resetting comprising lowering a reference voltage of a portion of the plurality of memory cells to a negative voltage level by injecting negative charge.

34. The method according to claim 33 further comprising coupling the reset unit to the data storage array on receiving the control signal.

35. The method according to claim 33 wherein the portion of the plurality of memory cells is a half portion of the plurality of memory cells.

* * * * *